(12) United States Patent
Lee

(10) Patent No.: US 6,845,041 B2
(45) Date of Patent: Jan. 18, 2005

(54) NON-VOLATILE SEMICONDUCTOR MEMORY DEVICE WITH ACCELERATED COLUMN SCANNING SCHEME

(75) Inventor: June Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 387 days.

(21) Appl. No.: 10/197,098

(22) Filed: Jul. 16, 2002

(65) Prior Publication Data

US 2003/0043628 A1 Mar. 6, 2003

(30) Foreign Application Priority Data

Aug. 28, 2001 (KR) ........................................ 2001-52057

(51) Int. Cl.[7] .............................................. G11C 16/04
(52) U.S. Cl. ............................ 365/185.17; 365/185.22; 365/185.33; 365/185.12
(58) Field of Search ....................... 365/185.17, 185.22, 365/185.33, 185.12

(56) References Cited

U.S. PATENT DOCUMENTS 5,712,818 A    1/1998  Lee et al.
5,920,503 A    7/1999  Lee et al.
6,011,720 A *  1/2000  Tanaka .................. 365/185.22

FOREIGN PATENT DOCUMENTS

JP    2001-023382    1/2001

OTHER PUBLICATIONS

English language of Abstract for Japanese patent publication No. 2001–023382.

* cited by examiner

Primary Examiner—Connie C. Yoha
(74) Attorney, Agent, or Firm—Marger Johnson & McCollom, P.C.

(57) ABSTRACT

A non-volatile semiconductor memory device of the present invention employs an acceleration technique for shortening a column scanning time. The acceleration technique can be realized by adjusting the width of an internal data bus, the adjusted width being selectively used according to an operation mode. When a normal read operation is executed, for example, a NAND-type flash memory device has an internal data bus width corresponding to the data input/output width. When an erase/program verify operation is executed, a NAND-type flash memory device has a wider internal data bus width than the data input/output width. According to the acceleration technique, it is possible to prevent any increase in the column scanning time in proportion to an increase in page size.

30 Claims, 15 Drawing Sheets

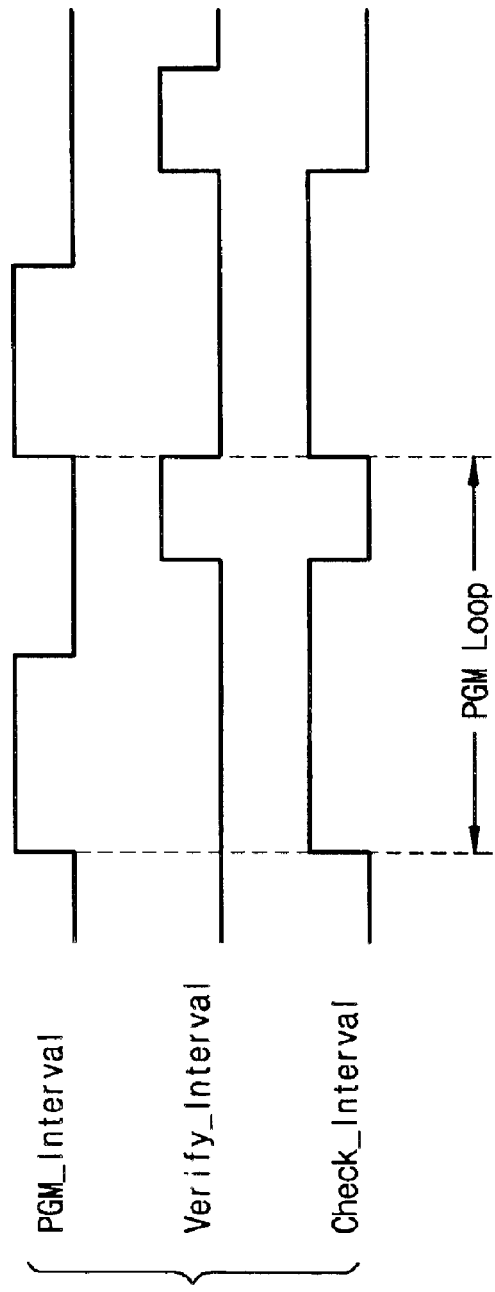

NON-VOLATILE SEMICONDUCTOR MEMORY DEVICE WITH ACCELERATED COLUMN SCANNING SCHEME

RELATED APPLICATION

This application relies for priority upon Korean Patent Application No. 2001-52057, filed on Aug. 28, 2001, the contents of which are herein incorporated by reference in their entirety.

FIELD OF THE INVENTION

The present invention relates to a data memory device. More particularly, the present invention relates to an electrically erasable and programmable non-volatile semiconductor memory device.

BACKGROUND OF THE INVENTION

An electrically erasable and programmable flash memory can preserve data without any power supply. Especially, having a string structure by which a plurality of flash memory cells are connected in series, a NAND-type flash memory can be useful in low-power, e.g. portable, products and can be manufactured at low cost. For these reasons, the NAND-type flash memory devices are in widespread use in various portable products.

Users gradually demand increased memory device functionality. One such demand is increased data input/output rate. This can be realized by increasing page size (or page depth) and memory block size. A page means a bundle of memory cells which are simultaneously selected when one word line is activated, and becomes a basic unit when read/program operations are executed. The memory block comprises multiple pages, and becomes a basic unit when an erase operation is executed.

FIG. 1 is a block diagram that illustrates a conventional NAND-type flash memory device. A NAND-type flash memory device includes a memory cell array 10, a row selecting circuit (or a row decoder circuit) 12, a page buffer circuit (or a data sensing and latching circuit) 14, and a column decoder circuit 16. The memory cell array 10 comprises a plurality of memory blocks BLK0~BLKn (where n is positive number), and each memory block includes a plurality of strings. As shown in FIG. 1, each string comprises a string selecting transistor SST connected to a corresponding bit line (for example, BL0), a ground selecting transistor GST connected to a common source line CSL, and memory cells MC15~MC0 which are connected between the string and ground selecting transistors SST and GST in series. The string selecting transistor SST, the memory cells MC15~MC0, and the ground selecting transistor GST are connected to a string selecting line SSL, word lines WL15~WL0 and a ground selecting line GSL, respectively. The signal lines SSL, WL15~WL0, GSL are electrically connected to signal lines SS, Si15~Si0, GS through corresponding block selecting transistors BS17~BS0. The block selecting transistors BS17~BS0 are controlled by a block selecting signal BS in common.

In continuous operation, a row selecting circuit 12 selects any one word line (or page) out of the word lines WL0~WL15 through the block selecting transistors BS0~BS17. The page buffer circuit 14 temporarily stores data to be stored in the memory cells of a selected page, or senses data stored in the memory cells of the selected page. The page buffer circuit 14 comprises columns related to the selected page, i.e. it comprises a plurality of page buffers which correspond to bit lines.

For example, as shown in FIG. 2, each page buffer can comprise a PMOS transistor M1 operating as a power supply, an NMOS transistor M2 operating as a pass transistor, inverters INV1 and INV2 forming a latch, and NMOS transistors M3 and M4 for controlling the latch. In the page buffer, data sensed from a corresponding memory cell during a read operation are loaded to a latch node ND_LAT, and other data to be stored (or programmed) in a corresponding memory cell during a program operation are loaded thereto. A detailed operation of the page buffer is disclosed in U.S. Pat. No. 5,712,818 entitled: "Data Loading Circuit For Parallel Program Of Nonvolatile Semiconductor Memory".

The data bits sensed from the memory cells of the selected page will be outputted, to a data bus or other external device, by a predetermined unit (e, g. a byte unit including 8 bits) through the column decoder circuit 16. FIG. 3 illustrates a part of a column decoder circuit according to a conventional technology. The circuit of FIG. 3 corresponds to one data line, and circuits of the same structure would be provided to correspond to other data lines. In FIG. 3, a notation "ND_LAT" indicates the latch node of the page buffer illustrated in FIG. 2. First selecting signals YA0~YA15 are sequentially activated and, substantially simultaneously, second signals YB0~YB15 are sequentially activated. For example, while each of the second selecting signals YB0~YB15 is activated, the first selecting signals YA0~YA15 are sequentially activated. Thus, as known from this structure and control manner, one data bit DL0 is selected out of 256 latched data bits ND_LAT0~ND_LAT255.

The page size and the block size typically are fixed in hardware when a flash memory is designed. Unlike a NOR-type flash memory, where data are randomly read out by a byte ×8 unit or a word ×16 unit, the NAND-type flash memory senses and latches data by a page unit over a relatively long time (for example, ~10 μs) by using the page buffer circuit 14. The latched data are sequentially fetched by the by the byte (×8) unit by toggling an nREx pin by an information processing system (e.g. a CPU). Thus, the NAND-type flash memory exhibits a relatively long latency when data are read out. On the contrary, once data are sensed and latched by a page buffer circuit, the NAND-type flash memory data output rate that is substantially higher.

The page size is on an increasing upward trend due to demand by users who want to increase data input/output rates. Such demand is explained by the following. Suppose that there are products having page sizes of 512 bytes (one speed), 1K bytes (double speed), and 2K bytes (quadruple speed). Under this supposition, when data of 8K bytes are sequentially read out, a product having the quadruple speed needs four read operations, another product having the double speed needs eight read operations, and still another product having the one speed needs sixteen read operations. As the page size decreases further, the time required for read/program operations continues to increase.

But as the page size is increased, the following problems arise. As is well known, the program/erase operations include a verify operation in order to determine whether a memory cell is normally programmed/erased. During the verify operation, memory cells of a selected page, i.e. bit lines, are sequentially scanned. This is also called "a verify scanning or column scanning operation."

In case of the erase operation, since the erase operation is executed for a relatively long time (for example, ~2 ms), generally, erase time is not limited by the time required for the column scanning operation. In the case of the page program, since the program operation is executed for a relatively short time (for example, ~240 μs), the time required for the column scanning operation (hereinafter, "column scanning time") cannot be neglected. Additionally, since the page program includes an algorithm for preventing the problem of excessively programmed memory cells, the column scanning time cannot be further neglected.

Consequently, as the page size is increased due to user demand, the column scanning time will increase in proportion to the increase in the page size. For example, if a period of a clock signal inputted in the column address counter is 50 ns and data latched in the page buffer circuit are pass/fail checked by a byte unit, the column scanning time of the one speed product is about 25 μs (50 ns×512) while that of the quadruple speed product is about 100 μs (50 ns×512×4). Thus, in conventional memory designs, NAND-type flash memory devices present a problem: the column scanning time increases as the page size increases.

SUMMARY OF THE INVENTION

It is an object of the present invention to provide a non-volatile semiconductor memory device comprising an internal data bus with an adjustable width according to an operation mode.

It is another object of the present invention to provide a non-volatile semiconductor memory device that avoids the problem of column scanning time increase resulting from a page size increase.

The present invention is directed to a flash memory device including a plurality of data input/output pins. A memory cell array includes memory cells arranged in a matrix form of a plurality of word lines and a plurality of bit lines. A readout circuit senses data bits stored in the memory cells through a plurality of the bit lines, and temporarily latches the sensed data bits. A column selecting circuit includes a first column selecting unit and a second column selecting unit. The first column selecting unit responds to first column selecting signals and second column selecting signals and sequentially selects first groups of latched data bits. The second column selecting unit responds to the first column selecting signals and third column selecting signals and sequentially selects second groups of latched data bits.

A column decoder circuit decodes a column address and generates the first, second and third column selecting signals. In order that data bits are simultaneously outputted from the first and second column selecting units during a verify operation, the second and third column selecting signals are sequentially and simultaneously activated. A controlling circuit generates output enable signals according to a portion of the column address bits during the verify operation. A multiplexer (boolean multiplier) circuit receives first output signals of the first column selecting unit and second output signals of the second column selecting unit, responds to the output enable signals during the verify operation, and multiplies corresponding output signals out of the first and second output signals. A pass/fail check circuit checks whether the output signals of the multiplier circuit have the same value. The number of the data bits selected by the first and second column selecting units is equal to that of the data input/output pins.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

In a non-volatile semiconductor memory device according to the present invention, especially, in a high-density NAND-type flash memory device, an acceleration technique is applied for shortening a column scanning time. The acceleration technique can be realized by adjusting the width of an internal data bus, the width being selectively used according to an operation mode. When a normal read operation is executed, for example, the NAND-type flash memory device has an inner data bus width corresponding to a data input/output width (for example, ×8). When an erase/program verify operation is executed, the NAND-type flash memory device has a wider inner data bus width (for example, ×32) than the data input/output width. This means that the number of simultaneously verified data bits is increased in one cycle of a clock signal during a verify operation. Thus, it is possible to prevent a problem that the column scanning time is increased in proportion to the increase in page size. This will be explained in detail below.

Figure 4:
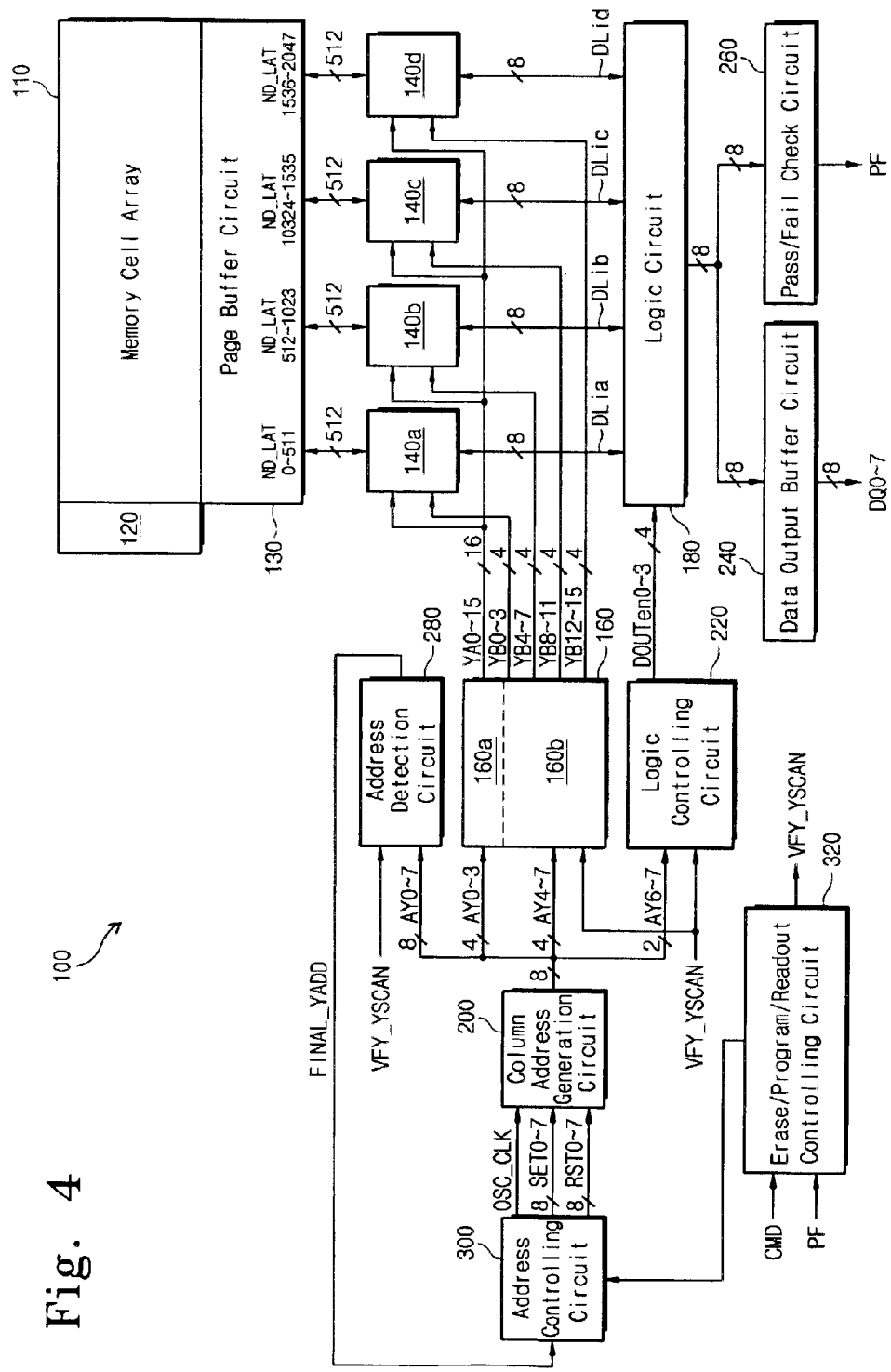
FIG. 4 is a block diagram showing a NAND-type flash memory device according to the present invention.

Referring to FIG. 4, a NAND-type flash memory device 100 includes a memory cell array 110, and the memory cell array 110 includes a plurality of strings that are not shown in FIG. 4 but that correspond to a plurality of bit lines. As already explained, each string comprises a string selecting transistor, a ground selecting transistor, and memory cells which are connected in series between the string selecting transistor and the ground selecting transistor. The memory cells of each string are connected to corresponding word lines, and each memory cell comprises a floating gate transistor having source, drain, floating gate, and a control gate.

Figure 1:
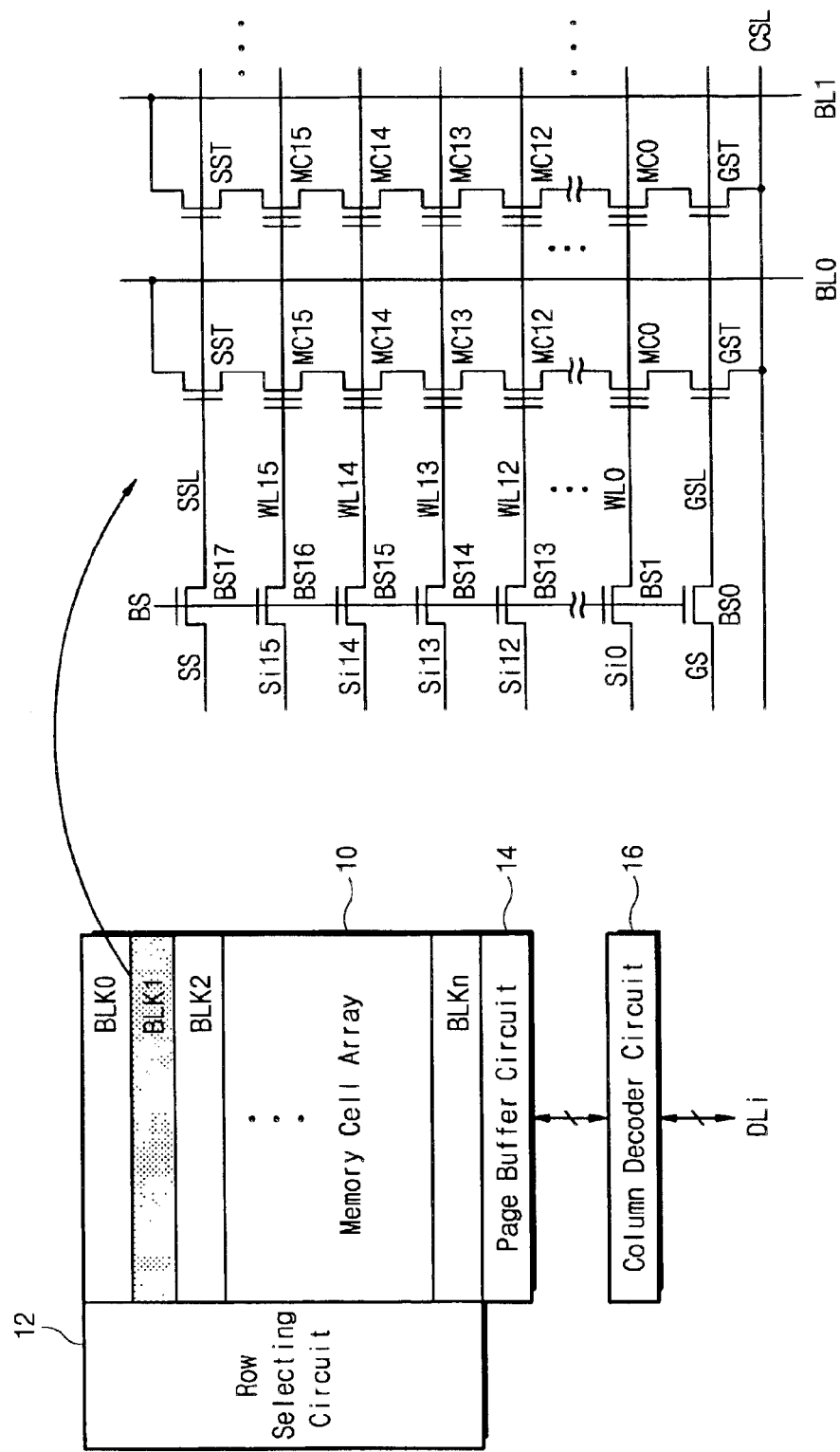
FIG. 1 is a block diagram showing a conventional NAND-type flash memory device.
Figure 2:
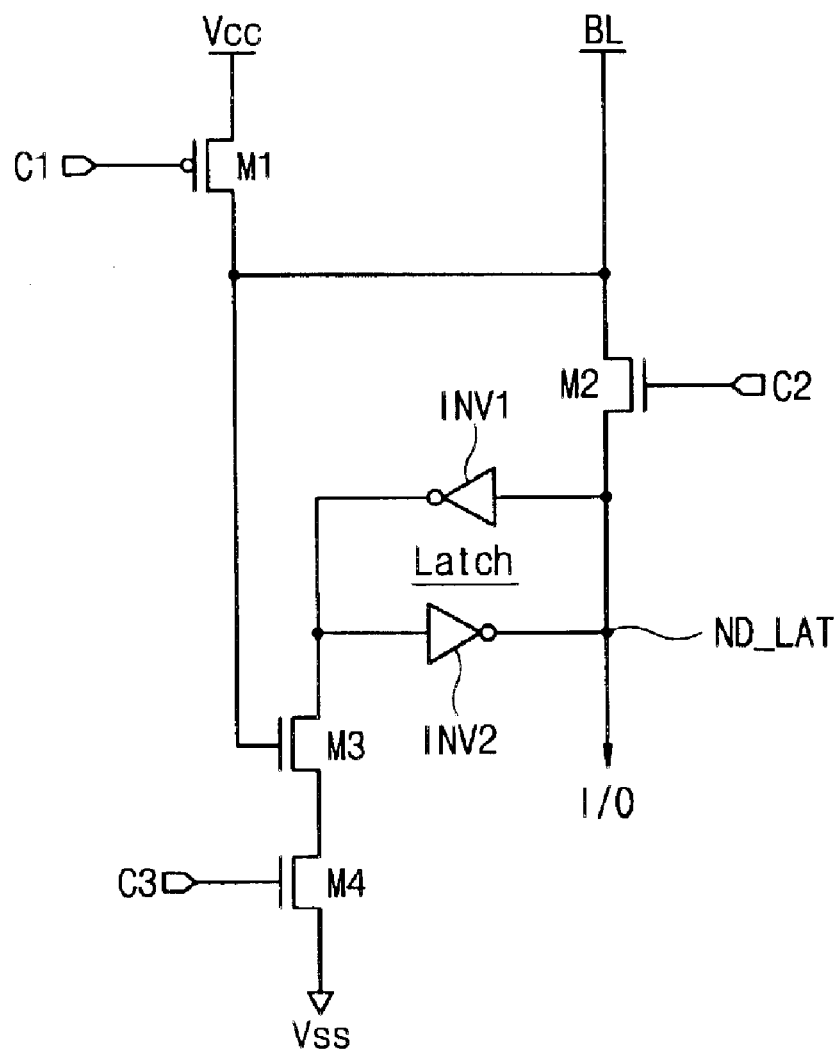
FIG. 2 is a circuit diagram showing a part of a page buffer circuit illustrated in FIG. 1.
Figure 3:
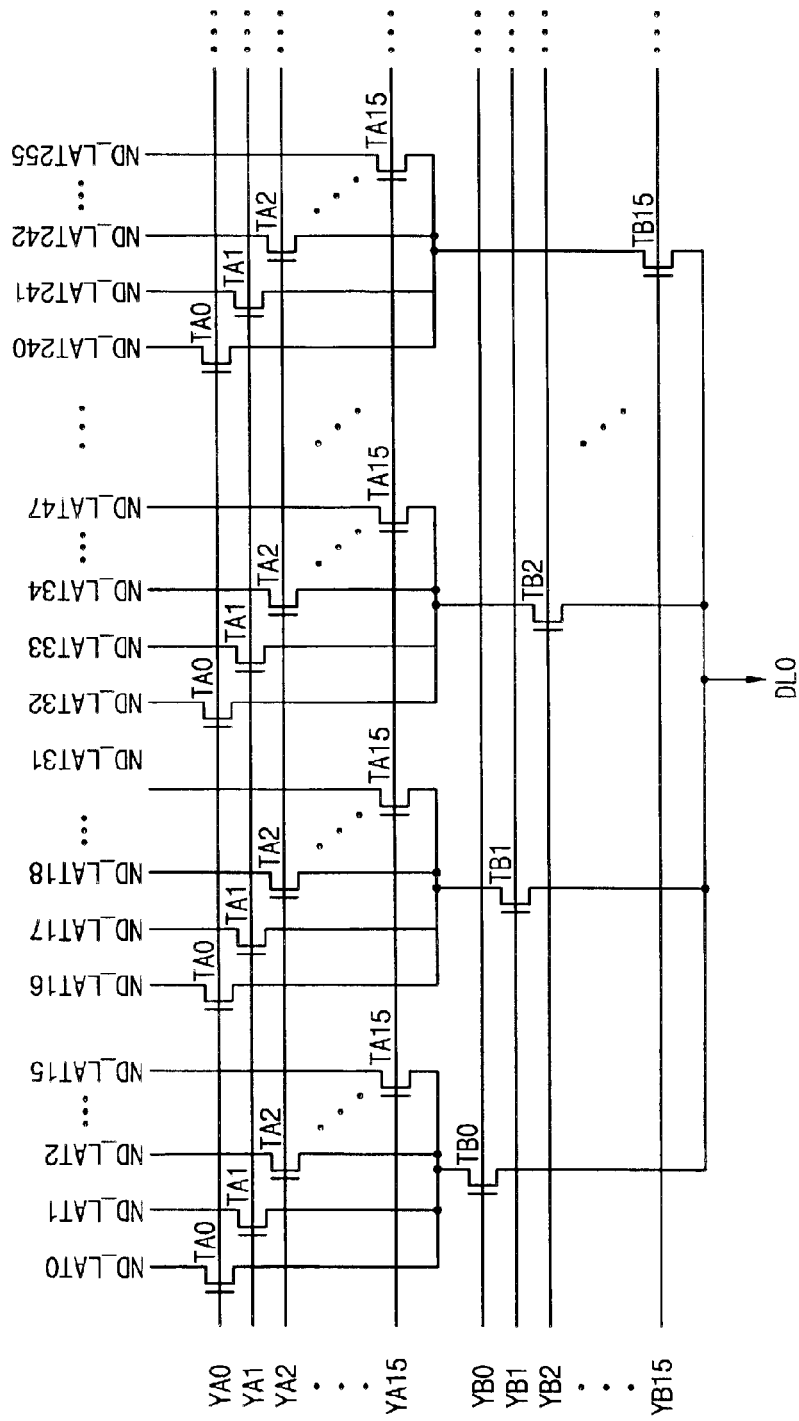
FIG. 3 is a circuit diagram showing a part of a column decoder circuit illustrated in FIG. 1.

A row selecting circuit 120 selects word lines of the memory cell array 110 according to a row address, as is known. As a readout circuit, a page buffer 130 senses data stored in the memory cell array 110 during the read/verify operations and temporarily latches the sensed data. In the page buffer circuit 130, data to be stored in the memory cell array 110 are loaded during the program operation. For example, if one page size is 2K ($K=2^{10}$) in the memory cell array 110, the page buffer circuit 130 is composed of 2048 page buffers. Each page buffer will be understood to have the same circuit structure as illustrated in FIG. 2.

Memory cells connected to one word line can comprise one page or two pages. In the case of one page, the number of the bit lines is equal to that of the page buffer. In the case of two pages, the number of the bit lines is twice the number of the page buffers. Of all the bit lines, some bit lines (e.g. odd bit lines) corresponding to a selected page are connected to the corresponding page buffers, and other bit lines (e.g. even bit lines) of an unselected page are fixed at a predetermined voltage (e.g. a ground voltage or a power voltage).

Still referring to FIG. 4, the NAND-type flash memory device 100 includes a column gate circuit divided into at least two column gate units (or column selecting units). In the illustrated embodiment, the column gate circuit comprises four column selecting units 140a, 140b, 140c, and 140d. If the page size is 2K, the column gate units 140a, 140b, 140c, and 140d correspond to groups of 512 page buffers, respectively. Each of the column selecting units 140a, 140b, 140c and 140d sequentially selects 512 data bits latched by page buffers of corresponding groups, under the control of a column pre-decoder circuit 160. The column selecting units 140a, 140b, 140c and 140d are electrically connected to a logic circuit 180 through corresponding internal data buses DLia, DLib, DLic, and Dlid (where i is 0~7 in the case of a byte unit).

The column pre-decoder circuit 160 responds to a column address AYi, (where i is 0~7) outputted from a column address generation circuit 200. It also responds to a verify enable signal VFY_YSCAN and generates column selecting signals YA0~YA15, YB0~YB3, YB4~YB4, YB8~YB11, and YB12~YB15. The column pre-decoder circuit 160 is divided into a first column pre-decoder block 160a and a second column pre-decoder block 160b. The first column pre-decoder block 160a generates column selecting signals YA0~YA15 by decoding lower address signals AY0~AY3 out of the column address signals AY0~AY7, and the second column pre-decoder block 160b generates residual column selecting signals YB0~YB3, YB4~YB7, YB8~YB11, and YB12~YB15.

The column selecting signals YA0~YA15 are provided to the first through fourth column selecting units 140a, 140b, 140c and 140d in common. Thus, the column selecting signals YA0~YA15 act as a common column selecting signal. The groups of the column selecting signals, YB0~YB3, YB4~YB7, YB8~YB11, and YB12~YB15 are provided to the corresponding column selecting units 140a, 140b, 140c and 140d, respectively. For example, the column selecting signals YB0~YB3 of the first group are provided to the first column selecting unit 140a; YB4~YB7 of the second group are provided to the second column selecting unit 140b; YB8~YB11 of the third group are provided to the third column selecting unit 140c; and YB12~YB15 of the fourth group are provided to the fourth column selecting unit 140d.

The common column selection signals YA0~YA15 are always sequentially activated without any relation to an operation mode, but residual column selecting signals YB0~YB3, YB4~YB7, YB8~YB11, YB12~YB15 are differently activated according to the operation mode. For example, in the case of a read operation, while column selecting signals, e.g. YB0~YB3, of a random group are sequentially activated, residual column selecting signals YB4~YB7, YB8~YB11, and YB12~YB15 are kept in a deactivated state. This means that data bits of a byte unit are transferred to a corresponding inner data bus, for example, Dlia, through a column selecting unit, e.g. 140a, corresponding to a group of activated column selecting signals. Other column selecting signals of residual groups are also activated by the same method with the former column selecting signals of the former group.

When an erase/program verify operation is executed, the column selecting signals of each group are simultaneously and sequentially activated. That is, column selecting signals YB0, YB4, YB8 and YB12 of each group are simultaneously selected, and then other column selecting signals YB1, YB5, YB9, and YB13 of each group are simultaneously selected. This means that data bits of the byte unit are transferred to the corresponding inner data buses DLia, DLib, DLic, DLid through the column selecting units 140a, 140b, 140c and 140d.

The logic circuit 180 is connected to column selecting units 140a~140D through the inner data buses DLia~DLid and controlled by a logic controlling circuit 220. The logic circuit 180 operates as a multiplexer or a multiplier according to the operation mode. When for example, a read operation is executed, the logic circuit 180 responds to data output enable signals DOUTen0~DOUTen3 from the logic controlling circuit 220 and outputs data outputted from the currently selected column selecting unit to a data output buffer circuit 240. When, for example, an erase/program verify operation is executed, the logic circuit 180 multiplies data bits transferred through the inner data buses DL0a~DL3d and outputs 8-bit data to a pass/fail checking circuit 260. This will be explained in detail below.

The logic controlling circuit 220 responds to upper column address signals AY6 and AY7 out of the column address signals AY0~AY7 and to a verify enable signal VFY_YSCAN informing an erase/program verify operation, and generates data output enable signals DOUTen0~DOUTen3. The data output enable signals DOUTen0~DOUTen3 are sequentially activated during the read operation and simultaneously activated during the erase/program verify operation. The address detection circuit 280 receives the column address AY0~AY7 from the column address generation circuit 200 and detects whether the column address AY0~AY7 is a final column address. If a currently inputted column address is a final column address, then an address detection circuit 280 activates a detection signal FINAL_YADD. An address controlling circuit 300 is controlled by an erase/program/readout controlling circuit 320, and generates a clock signal OSC_CLK, preset signals SET0~SET7, and clear signals RST0~RST7, all of which are supplied to the column address generation circuit 200. The clock signal OSC_CLK is not generated when the detection signal FINAL_YADD is active. The verify enable signal VFY_YSCAN is deactivated when a PF signal outputted from the pass/fail check circuit 260 indicates an erase/program failure.

As explained above, the NAND-type flash memory device according to the present invention has a structure of the internal data bus with an adjustable width according to an operation mode. The data bus width×32 during the erase/program verify operation is widened in comparison with the data bus width ×8 during the read operation. This means that the number of simultaneously verified data bits is increased in one cycle of a clock signal when the verify operation is executed. Thus, it is possible to prevent any increase in the column scanning time in proportion to an increase in the page size.

Figure 5:
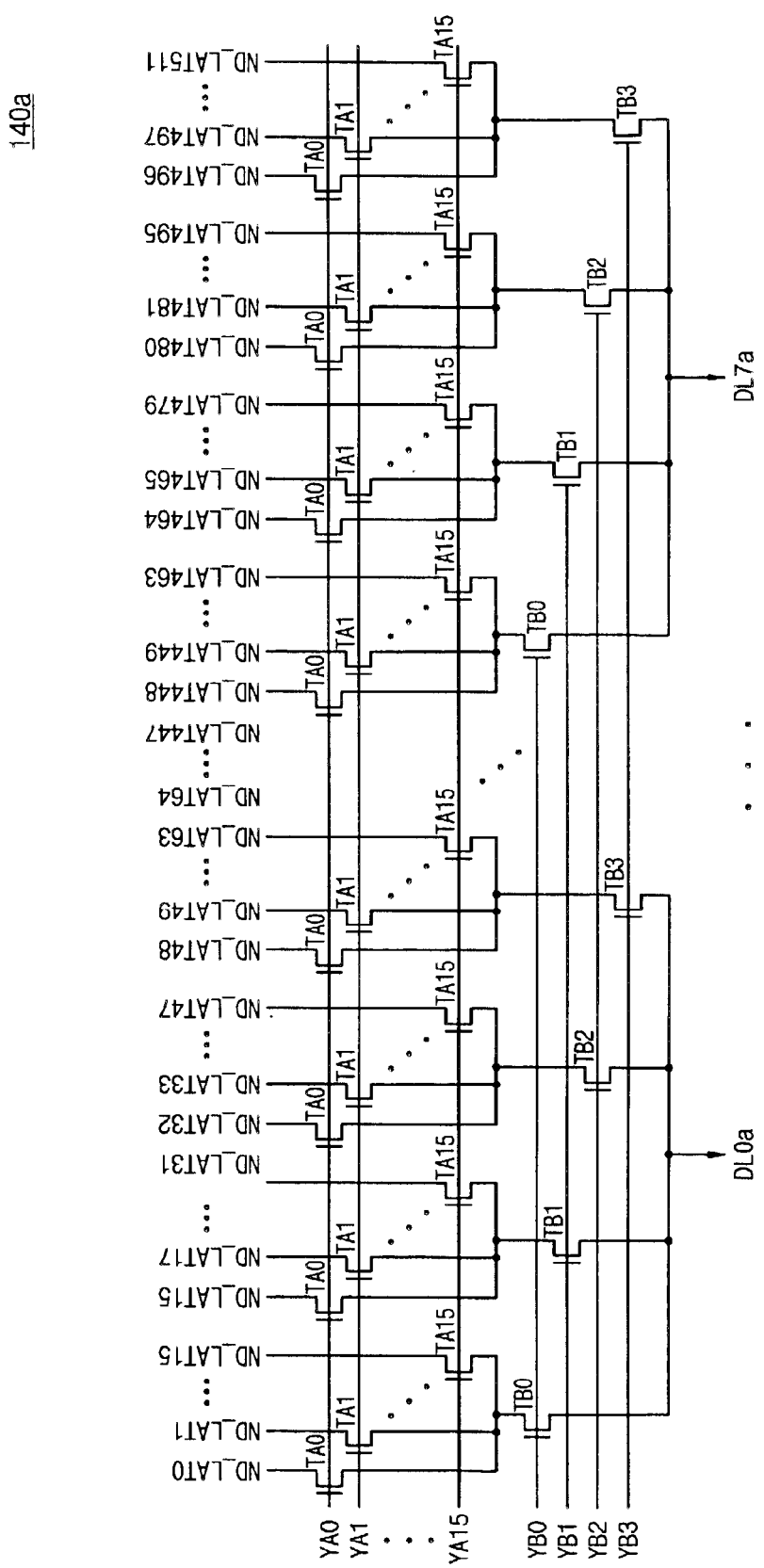
FIG. 5 illustrates a preferred embodiment of a column selecting unit illustrated in FIG. 4.

Referring to FIG. 5, the column selecting unit 140a comprises a plurality of NMOS transistors TA0~TA15, TB0~TB3 in a two-stage switch structure arrangement. NMOS transistors forming an upper stage of the switch circuit are controlled by the first column selecting signals YA0~YA15 from the column pre-decoder circuit 160. Other NMOS transistors forming a lower stage of the switch circuit are controlled by the second column selecting signals YB0~YB3 from the column pre-decoder circuit 160. When any one of the first column selecting signals is selected and another of the second column selecting signals is selected, the column selecting unit 140a transfers eight data bits out of the data bits ND_LAT0~ND_LAT511 of page buffers of a corresponding group to the corresponding internal data bus DL0a~DL7a. Residual column selecting units 140b, 140c, and 140d are the same as the structure illustrated in FIG. 5.

Figure 6:
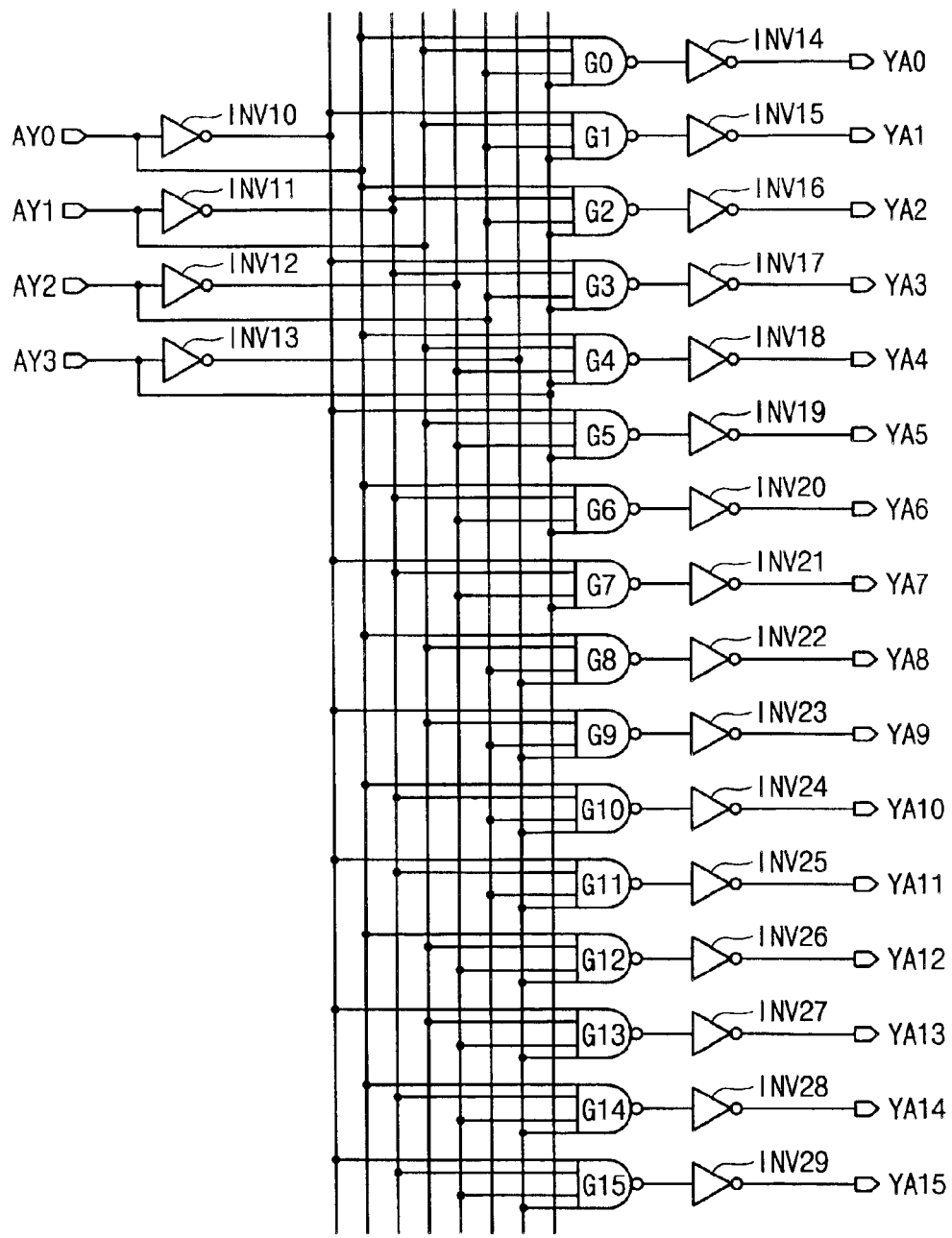
FIG. 6 illustrates a preferred embodiment of a first column pre-decoder unit of a column pre-decoder circuit illustrated in FIG. 4.

Referring to FIG. 6, a first column pre-decoder block 160a decodes the column address signals AY0~AY3 and sequentially activates the column selecting signals YA0~YA15 by decoding the column address signals AY0~AY3. The column selecting signals YA0~YA15 are provided in common to the column selecting units 140a~140d forming the column gate circuit. The first column pre-decoder block 160a comprises inverters INV10~INV29 and NAND gates G0~G15, connected as shown.

Figure 7:
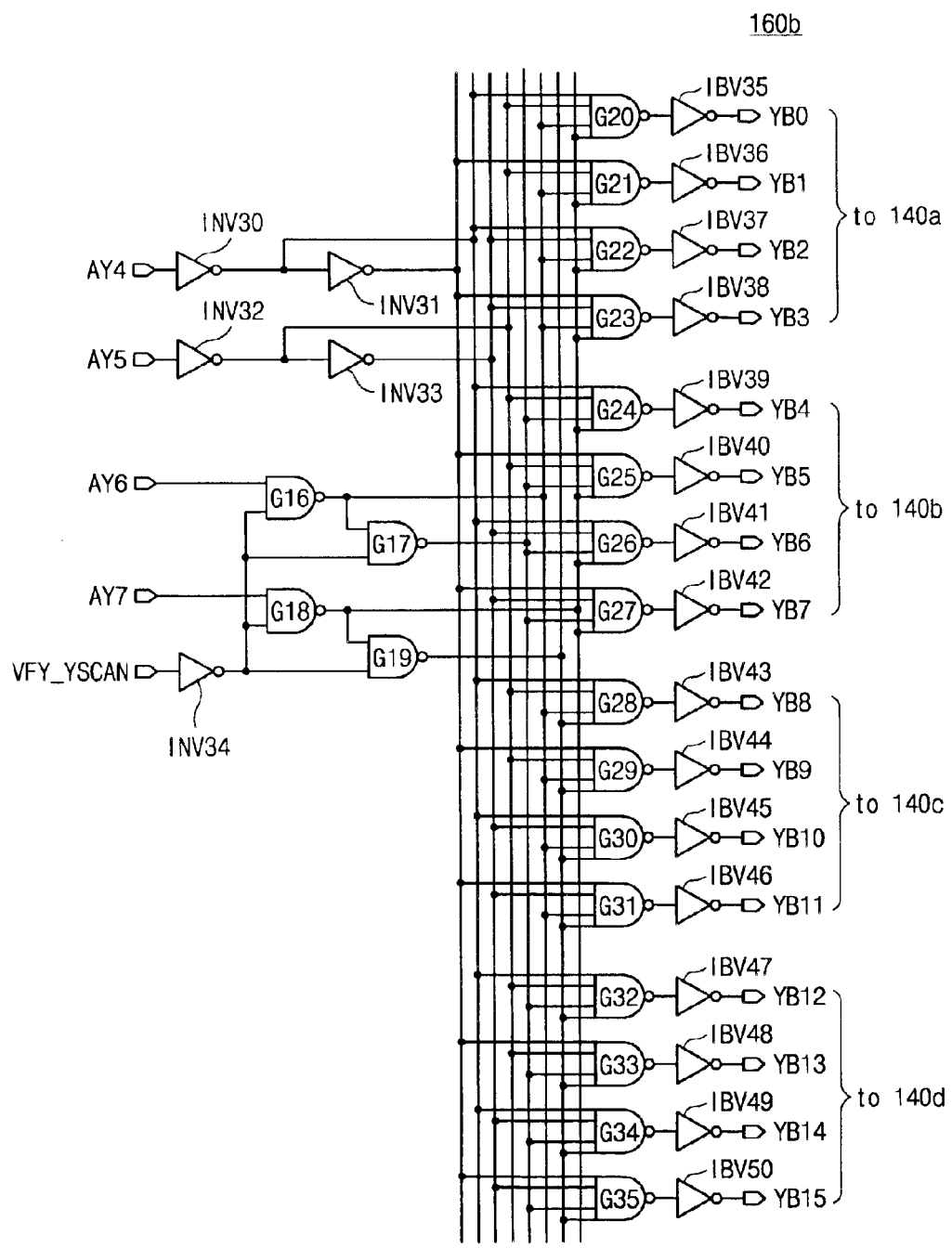
FIG. 7 illustrates a preferred embodiment of a second column pre-decoder unit of a column pre-decoder circuit illustrated in FIG. 4.

Referring to FIG. 7, a second column pre-decoder block 160b is composed of inverters INV30~INV50 and NAND gates G16~G35, connected as shown. The second column pre-decoder block 160b responds to the column address signals AY4~AY7 and to the verify enable signal VFY_YSCAN and generates the column address signals YB0~Y315. When the verify enable signal VFY_YSCAN has a low level, i.e. when the erase/program verify operation is not executed, the column selecting signals YB0~YB15 are sequentially activated (selected) according to the column address signals AY4~AY7. When the verify enable signal VFY_YSCAN has a high level, i.e. when the erase/program verify operation is executed, the column selecting signals of each group, (YB0, YB4, YB8, YB12), (YB1, YB5, YB9, YB13), (YB2, YB6, YB10, YB14), and (YB3, YB7, YB11, YB15), are simultaneously and sequentially activated (selected). For example, the column selecting signals YB0, YB4, YB8, YB12 of each group are simultaneously selected and residual column selecting signals are kept in a deactivation state. Then, the next column selecting signals YB1, YB5, YB9, YB13 of each group are simultaneously selected and the residual column selecting signals are kept in a deactivation state.

Figure 8:
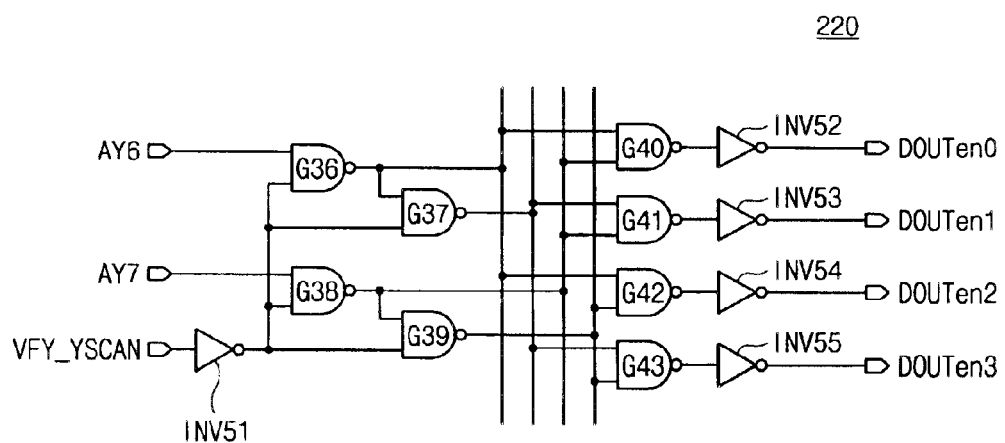
FIG. 8 illustrates a preferred embodiment of a logic controlling circuit illustrated in FIG. 4.

Referring to FIG. 8, the logic controlling circuit 220 responds to the column address signals AY6, AY7 and the verify enable signal VFY_YSCAN and generates data output enable signals DOUTen0~DOUTen3. The logic controlling circuit 220 is composed of inverters INV51~INV55 and the NAND gates G36~G43, connected as shown. When the verify enable signal VFY_YSCAN is a low level, i.e. when the read operation is executed, data output enable signals DOUTen0~DOUTen3 are sequentially activated according to the column address signals AY6, AY7. When the verify enable signal VFY_YSCAN is a high level, i.e. when the erase/program verify operation is executed, the data output enable signals DOUTen0~DOUTen3 are simultaneously activated without any relation to the column address signals AY6 and AY7.

Figure 9:
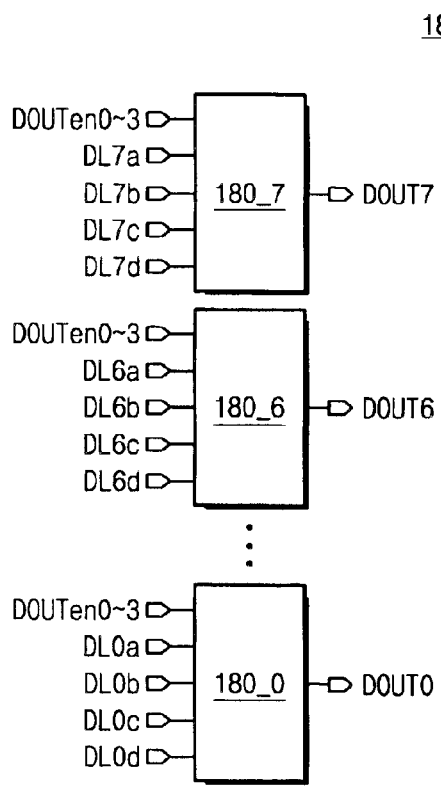
FIG. 9 is a block diagram showing a logic circuit illustrated in FIG. 4.

Referring to FIG. 9, the logic circuit 180 is composed of eight logic units 180_0~180_7 which correspond to eight data input/output pins. Each internal data bus width is equal to data input/output width determined by the data input/output pins. Each of logic units 180_0~180_7 operates as a multiplexer or boolean multiplier (logic AND circuit) according to the data input enable signals DOUTen0~DOUTen3 which are outputted from the logic controlling circuit 220. The data output enable signals DOUTen0~DOUTen7 are provided to the logic units 180_0~180_7 in common. Each of the logic units 180_0~180_7 responds to the data output enable signals DOUTen0~DOUTen7 and outputs any one of the corresponding data bits or the multiplied result of the corresponding data bits. For example, the first logic unit 180_0 receives first data bits DL0a~DL0d out of the data bits which are transferred through the internal data buses DLia~DLid, and the eighth logic unit 180_7 receives the final data bits DL7a~DL7d out of the data bits which are transferred through the internal data buses DLia~DLid.

Figure 10:
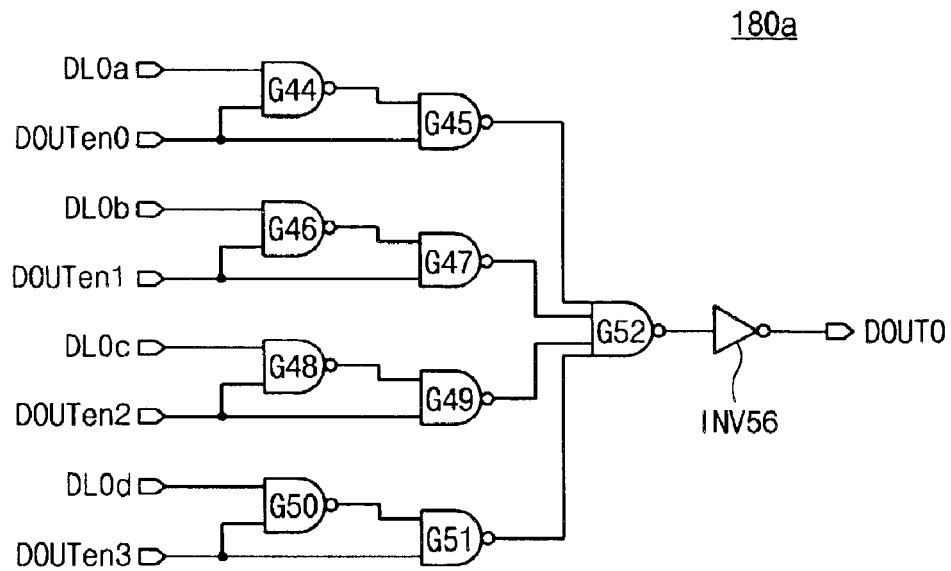
FIG. 10 illustrates a preferred embodiment of a logic unit illustrated in FIG. 9.

Referring to FIG. 10, the logic unit 180a is composed of NAND gates G44~G52 and an inverter INV56, connected as shown. As explained from the above, the data output enable signals DOUT en0~DOUT en3 are selectively or simultaneously activated according to the operation mode. In the case of the selective activation, for example, when the data output enable signal DOUTen0 is activated (e.g. a high level) and the residual data output enable signals DOUTen1~DOUTen3 are deactivated (e.g. a low level), only the data bit DL0a is assumed to be valid, the residual data bits DL0b~DL0d being disabled by the corresponding data output enable signals DOUTen1~DOUTen3. The residual data bits (or data lines) DL0b~DL0d will be maintained in a high impedance (or floating) state, as is known. In the case of a simultaneous activation, since the logic unit 180a operates as a logic AND circuit, the data bits DL0a~DL0d are multiplied.

Figure 11:
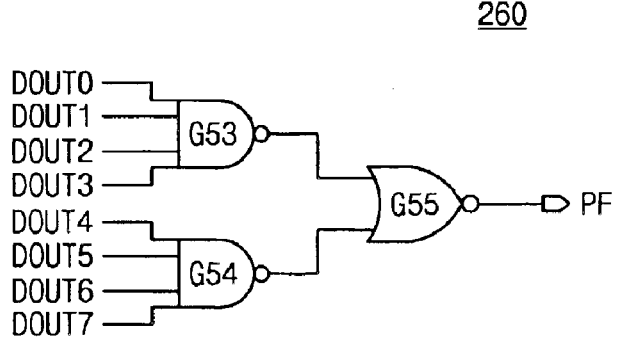
FIG. 11 illustrates a preferred embodiment of a pass/fail check circuit illustrated in FIG. 4.

Referring to FIG. 11, the pass/fail check circuit 260 is composed of two NAND gates G53, G54 and one NOR gate G55, connected as shown. The pass/fail check circuit 260 determines whether the output signals DOUT0~DOUT7 of the logic circuit 180 illustrated in FIG. 4 have the same value. When the output signals DOUT0~DOUT7 have the same value, i.e. when the erased/programmed memory cells are normally erased/programmed, the pass/fail check circuit 260 outputs a discrimination signal PF of a high level. When at least one of the output signals DOUT0~DOUT7 has a different value from the residual signals, i.e. when the erased/programmed memory cells are not normally erased/programmed, the pass/fail check circuit 260 outputs the discrimination signal PF of a low level. The erase/program/ readout controlling circuit 320 of FIG. 4 terminates the current verify operation according to the discrimination signal PF of the low level.

Figure 12:
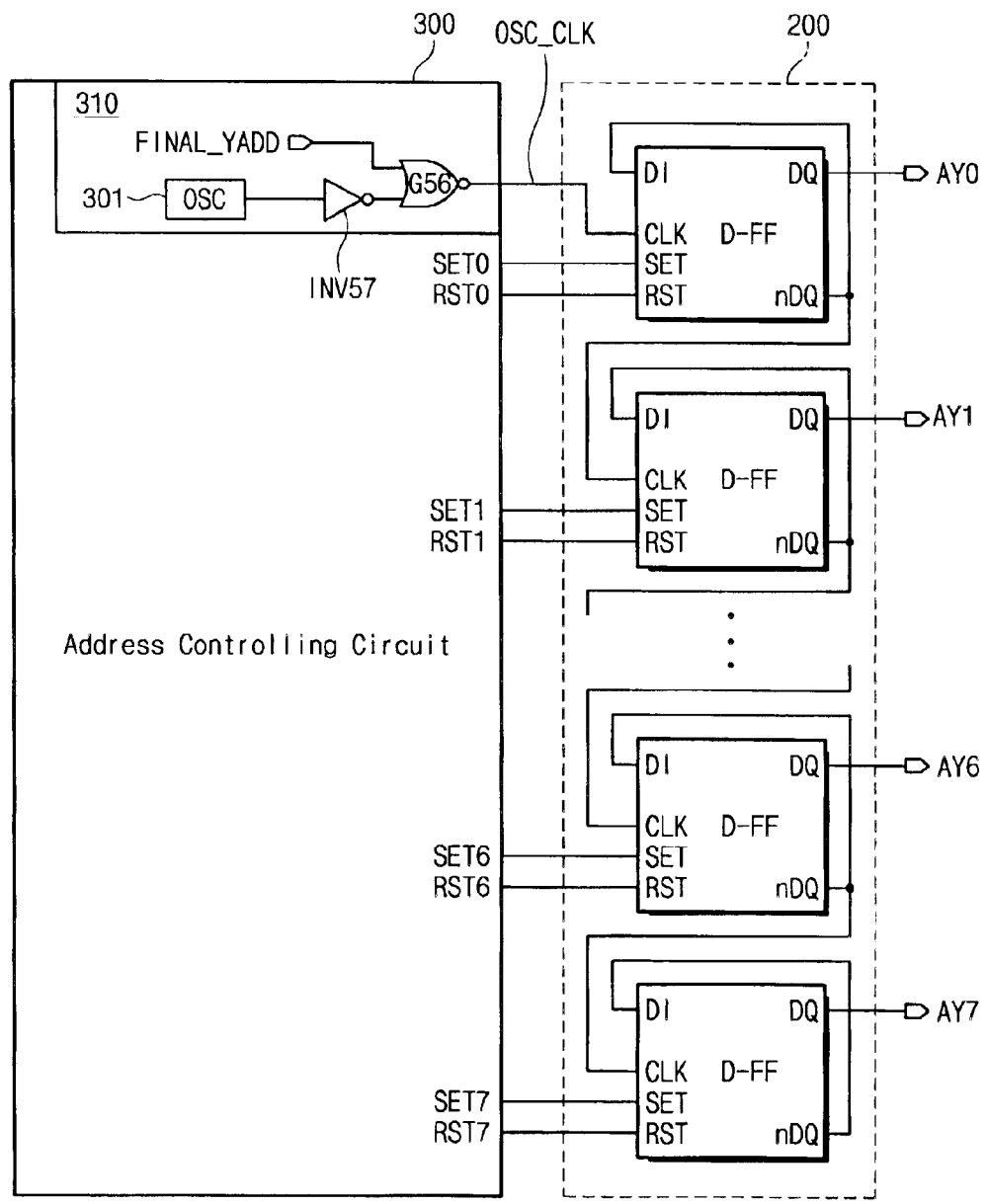
FIG. 12 illustrates a preferred embodiment of an address controlling circuit and a column address generation circuit illustrated in FIG. 4.

Referring to FIG. 12, the address controlling circuit 300 is controlled by the erase/program/readout controlling circuit 320, and outputs the clock signal OSC_CLK, the preset signals SET0~SET7, and the clear signals RST0~RST7 to the column address generation circuit 200. The address controlling circuit 300 includes a clock supply unit 310 comprising an oscillator 301, an inverter INV57 and a NOR gate G56. The oscillator 301, which is well known in this field, generates an oscillating signal OSC of a predetermined frequency. A detection signal FINAL_YADD is supplied from the address detection circuit 280 to one input terminal of the NOR gate G56, and an output signal of the oscillator OSC is supplied through the inverter INV57 to another input terminal of the NOR gate G56. As a clock signal OSC_CLK, the output signal of the oscillator 301 is enabled or disabled according to the level of the detection signal FINAL_YADD.

For example, when a detection signal FINAL_YADD of high level, informing that the final column address is detected, is inputted to the NOR gate G56, the output signal of the oscillator 301 is disabled. When the detection signal FINAL_YADD of a low level, informing that the final column address is not detected, stet inputted to the NOR gate G56, the output signal of the oscillator 301 is enabled and outputted as a clock signal OSC_CLK.

The column address generation circuit 200 is controlled by an address controlling circuit 300 and generates a column address AYi, (where i is 0~7) according to the clock signal OSC_CLK supplied from the address controlling circuit 300. The column address generation circuit 200 is composed of edge-triggered D flip-flops (D-FFs) and each of the flip-flops has an input terminal DI, output terminals DQ and nDQ, a clock terminal CLK, a preset terminal SET and a clear terminal RST. The D flip-flops of the column address generation circuit 200 are reset by the corresponding clear signals RST0~RST7 outputted from the address controlling circuit 300.

Figure 13:
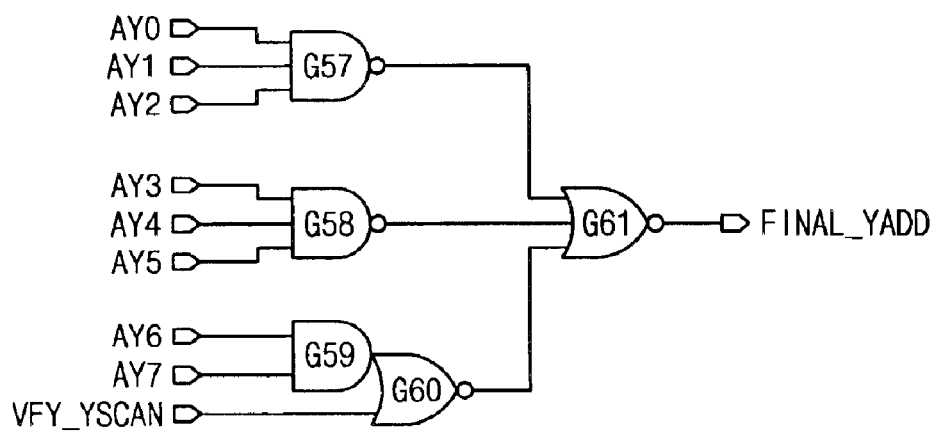
FIG. 13 illustrates a preferred embodiment of an address detection circuit illustrated in FIG. 4.

Referring to FIG. 13, the address detection circuit 280 determines whether the column address AY0~AY7 from the column address generation circuit 200 is the final column address. If the column address AY0~AY7 from the column address generation circuit 200 is the final column address, then the address detection circuit 280 outputs the detection signal FINAL_YADD of a high level. If the column address AY0~AY7 from the column address generation circuit 200 is not the final column address, then the address detection circuit 280 outputs the detection signal FINAL_YADD of a low level. When the selected page size is 2K (256 bytes), an 8-bit column address is required for input/output of data by the byte unit. When the erase/program verify operation is executed in the present invention, i.e. when the erase/ program verify operation is executed by 32-bit unit for shortening the column scanning time, a 6-bit column address is required. For this reason, a verify enable signal VFY_SCAN is used in the address detection circuit 280. If the verify enable signal VFY_SCAN is a high level, the column address signals AY6 and AY7 inputted to the address detection circuit 280 become 'don't cares'.

Figure 14A:
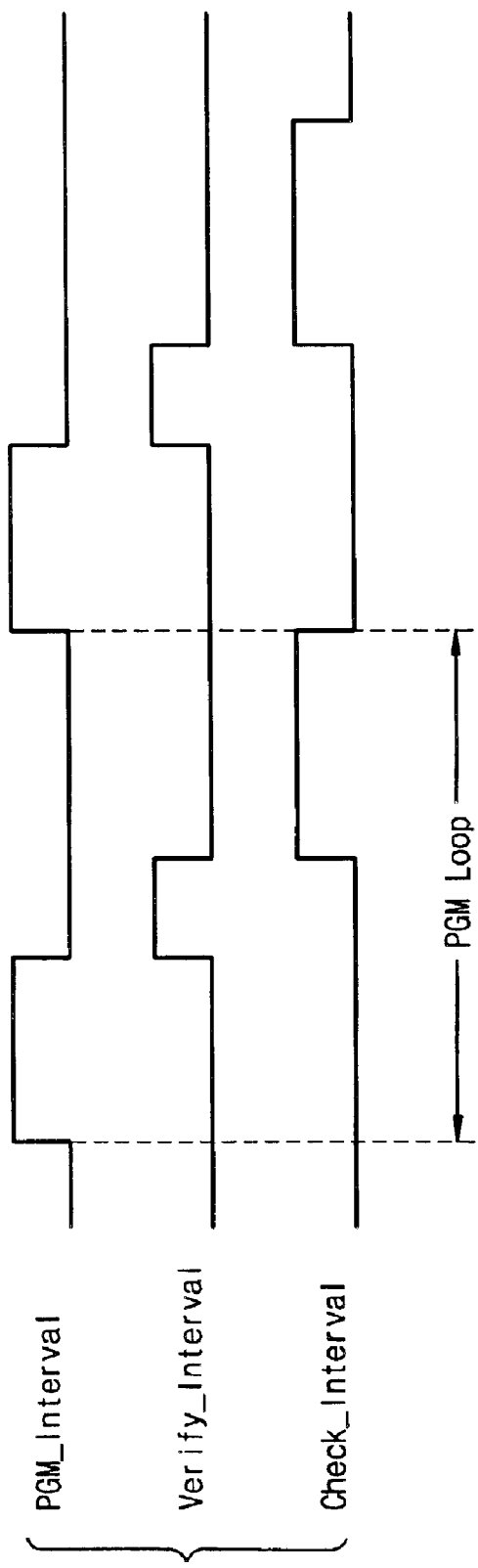
FIG. 14 is a diagram explaining a program operation mode of a NAND-type flash memory device according to the present invention.

In the case of the NAND-type flash memory device, the program operation includes a plurality of program loops. As is well known, each program loop can be distinguished by a program interval, a verify interval, and a pass/fail check interval. During the program interval, data are stored in the memory cells of the selected page. A red operation for the selected page is performed during the verify interval. During the pass/fail check interval, it is determined whether the programmed memory cells are normally programmed. The program and pass/fail check intervals of the program loop can be designed to be not overlapped, as illustrated in FIG. 14A. On the contrary, the program interval and the pass/fail check intervals of the program loop can be designed to be overlapped as illustrated in FIG. 14B. It will be well understood by those skilled in the art that such a column scanning operation to shorten the column scanning time is applicable to all pass/fail check intervals, illustrated in FIGS. 14A and 14B, thereby to reduce the time for reach program loop (PGM Loop).

Figure 15:
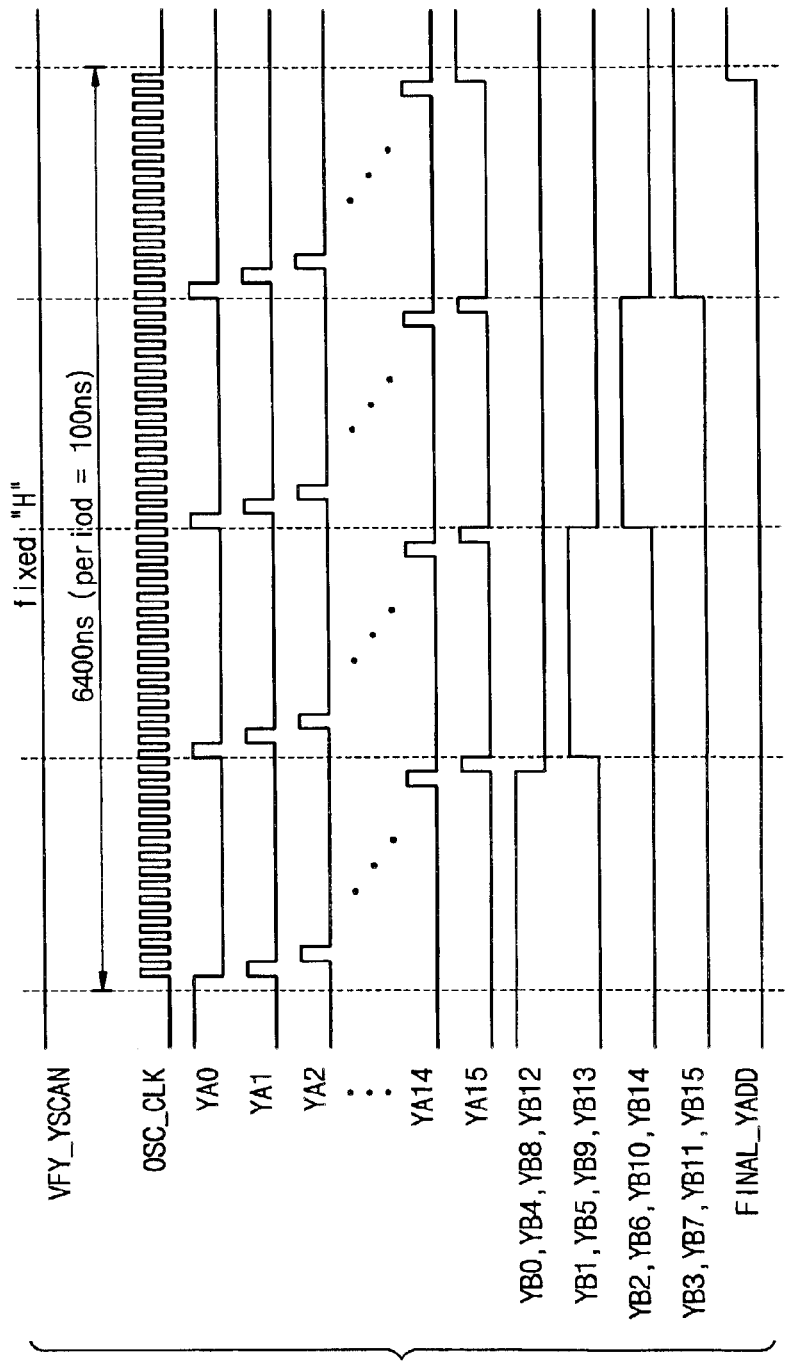
FIG. 15 is an operation timing diagram explaining a column scanning operation of a NAND-type flash memory device according to the present invention.

Referring to FIG. 15, memory cells of a random selected page are programmed. In order to discriminate whether the programmed memory cells are normally programmed, the erase/program/readout controlling circuit 320 activates a verify enable signal VFY_YSCAN (fixed "H") which informs the column scanning operation. Since the detection signal FINAL_YADD supplied to a clock supply unit 310 of the address controlling circuit 300 is maintained at a low level, the clock signal OSC_CLK is supplied to the column address generation circuit 200. The column address generation circuit 200 generates the column address AY0~AY7 which are motivated by the clock signal OSC_CLK. The column pre-decoder circuit 160 responds to the column address AY0~AY7 and generates the column selecting signals YA0~YA15 and YB0~YB15.

Since the column scanning operation is executed, during the interval that column selecting signals YA0~YA15 are sequentially activated, other column selecting signals YB0, YB4, YB8, YB12 are maintained at the activation state. Thus, data bits latched in the page buffers of groups corresponding to the column selecting units 140a~140d are transferred to the internal data buses DLia~DLid corresponding to a byte unit. That is, the width of the internal data bus is widened from x8 to x32. In comparison with the column scanning operation using the internal data bus width of x8, a different column scanning operation using the other internal data bus width of x32 is accelerated, thereby quadrupling the speed.

Since the data output enable signals DOUTen0~DOUTen3 outputted from the logic controlling circuit 220 are all maintained at the activation state (e.g. a high level), the logic circuit 180 illustrated in FIG. 4 operates as a logic AND circuit. The logic units 180_0~180_7 of the logic circuit 180 respond to the data output enable signals DOUTen0~DOUTen3, multiply the corresponding data bits (DL0a~DL0d)~(DL7a~DL7d), and transfer the multiplied results DOUT0~DOUT7 to the pass/ fail check circuit 260. These described operations will be repeatedly carried until all of the column selecting signals YA0~YA15 are selected.

Until all of the column selecting signals YA0~YA15 are selected, as described above, first column selecting signals YB0, YB4, YB8, YB12 are continuously maintained at the activation state. In the case that the column selecting signals YA0~YA15 are all selected, the column selecting signals YB0, YB4, YB8, YB12 are deactivated, but the other column selecting signals YB1, YB5, YB9, Yb13 are all activated. While the other column selecting signals YB1, YB5, YB9, YB13 are all maintained at the activation state, the column scanning operation will be executed by the same method as described above. While the column selecting signals YB3, YB7, YB11, YB15 of the last group are maintained at the activation state, if the final column selecting address is detected by the address detection circuit 280, then the detection signal FINAL_YADD changes from a low level to a high level, as illustrated in FIG. 15. This inhibits the clock supply unit 310 of the address controlling circuit 300 from supplying the clock signal OSC_CLK. That is, the column scanning operation is terminated.

Figure 16:
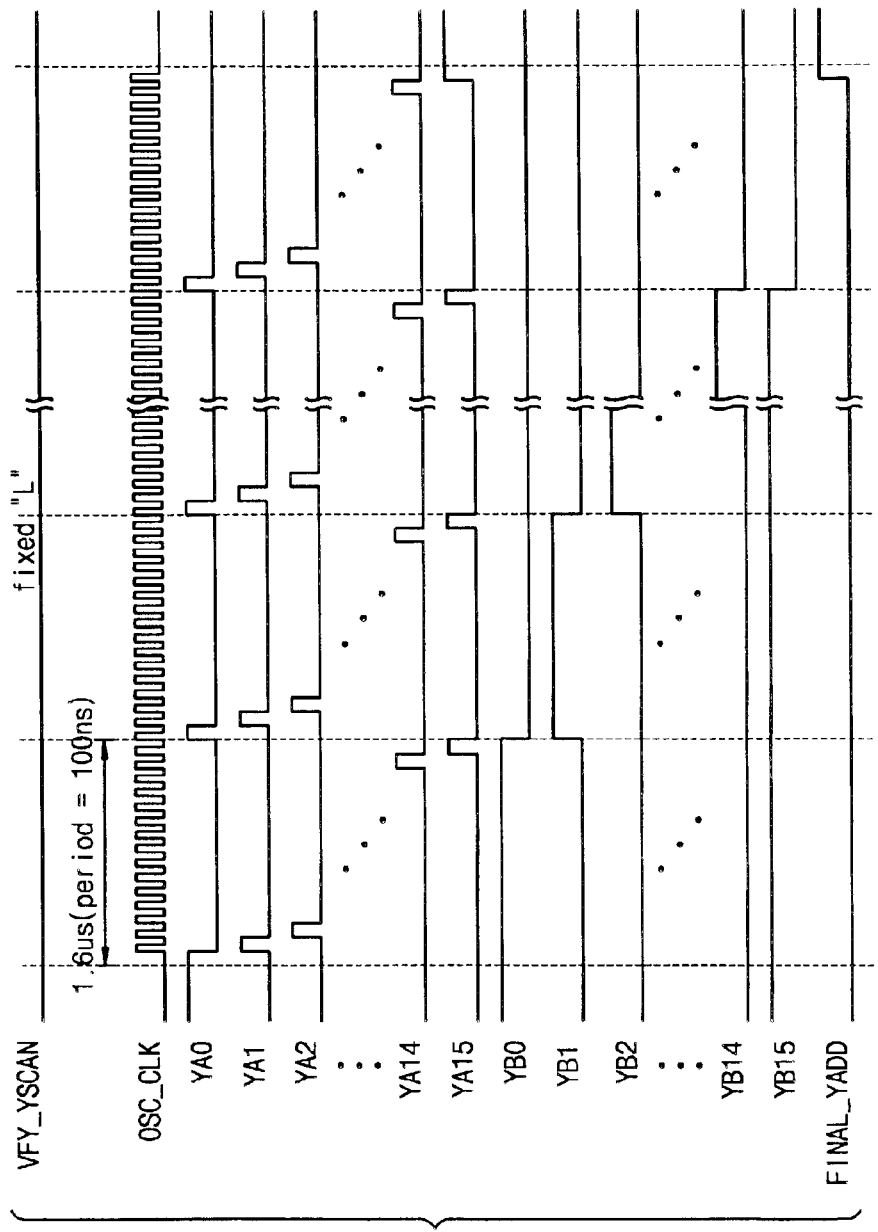
FIG. 16 is an operation timing diagram explaining a read operation of a NAND-type flash memory device according to the present invention.

If the period of the clock signal is 100 ns, the column scanning time according to the present invention is about 6400 ns. This is one fourth of the other scanning time (about 25,600 ns) taken when the normal read operation is executed. When the normal read operation is executed, the verify enable signal VFY_YSCAN is maintained at a low level (fixed "L"). This means that the column selecting units 140*a*~140*d* are sequentially selected according to the control of the column pre-decoder circuit 160. In other words, as illustrated in FIG. 16, while the column selecting signals YA0~YA15 are sequentially activated, only one of the column selecting signals YB0~YB15 is maintained at the activation state (e.g. a high level). The residual column selecting signals are kept as the deactivation state (e.g. a low level). Data bits of page buffers of a group corresponding to one column selecting unit are transferred to the logic circuit 180 through one internal data bus. Next, other data bits of other page buffers of another group corresponding to other column selecting unit are transferred to the logic circuit 180 through each of the other internal data buses. Likewise with the conventional technology, this means that the read operation is executed by using the same internal data bus width ×8 as the data input/output width ×8.

As described above, when an erase/program verify operation is executed, by effectively widening the internal data bus width from ×8 to ×32, for example, it is possible to avoid any increase in column scanning time resulting from an increase in page size.

Although the present invention has been shown and described with respect to various preferred embodiments thereof, numerous variations and modifications will be apparent to those skilled in the art. The present invention is therefore not limited to the specific embodiments described above but should be interpreted to cover all such variations and modifications coming within the spirit and scope of the invention as defined by the appended claims.

What is claimed is:

1. A non-volatile semiconductor memory device with a predetermined data input/output width, comprising:

a memory cell array of memory cells arranged into a matrix form of a plurality of rows and a plurality of columns;

a readout circuit for reading out data from the memory cell array through the plurality of the columns and temporarily storing the readout data;

an internal data bus connected between the readout circuit and a data output circuit, for transferring data from the readout circuit to the data output circuit; and a bus controlling circuit for adjusting a width of the internal data bus according to an operation mode to make the width of the inner data bus wider than the predetermined data input/output width of the memory device during a verify operation.

2. The non-volatile semiconductor memory device as claimed in claim 1, wherein the internal data bus has a first width during a read operation and a second width during the verify operation, the second width being greater than the first width.

3. The non-volatile semiconductor memory device as claimed in claim 2, wherein the first width of the internal data bus is the same as the predetermined data input/output width of the memory device.

4. The non-volatile semiconductor memory device as claimed in claim 3, wherein the second width of the internal data bus is at least twice the first width.

5. The non-volatile semiconductor memory device as claimed in claim 4, wherein, when a program loop includes a program interval and a verify interval, the verify interval occurs after the program interval.

6. The non-volatile semiconductor memory device as claimed in claim 4, wherein, when a program loop includes a program interval and a verify interval, the verify interval occurs during the program interval.

7. A flash memory device with a plurality of data/input/output pins, comprising:

a memory cell array of memory cells arranged into a matrix form having a plurality of word lines and a plurality of bit lines;

a readout circuit for sensing a plurality of data bits stored in the memory cells through the plurality of the bit lines and for temporarily latching the sensed data bits;

a column selecting circuit including a first column selecting unit and a second column selecting unit, wherein the first column selecting unit responds to first column selecting signals and second column selecting signals and sequentially selects first groups of latched data bits, and wherein the second column selecting unit responds to first column selecting signals and third column selecting signals and sequentially selects second groups of latched data bits;

a column decoder circuit for decoding a column address and generating the first through third column selecting signals, wherein the second and third column selecting signals are sequentially and simultaneously activated to cause data bits to be simultaneously outputted from the first and second column selecting units during a verify operation;

a controlling circuit for generating output enable signals according to a portion of column address bits during the verify operation;

a multiplier circuit for receiving first output signals of the first column selecting unit and second output signals of the second column selecting unit and for multiplying corresponding ones of the first and second output signals in response to the output enable signals during the verify operation; and a pass/fail check circuit for determining whether output signals of the multiplier circuit have the same value, wherein a number of data bits selected by each of the first and second column selecting units is the same as the number of the data input/output pins.

8. The flash memory device as claimed in claim 7, further comprising an address detection circuit for receiving the column address and detecting whether the column address is a final column address during the verify operation.

9. The flash memory device as claimed in claim 8, wherein generation of the column address is stopped when the final column address is detected.

10. The flash memory device as claimed in claim 7, wherein, when a program loop includes a program interval and a verify interval, the verify interval occurs after the program interval.

11. The flash memory device as claimed in claim 7, wherein, when a program loop includes a program interval and a verify interval, the verify interval is executed in the program interval.

12. The flash memory device as claimed in claim 7, wherein the column decoder circuit generates the first through third column selecting signals such that all first groups of the latched data bits are sequentially selected by the first column selecting unit and all second groups of the latched data bits are sequentially selected by the second column selecting unit during a read operation.

13. The flash memory device as claimed in claim 12, wherein the multiplier circuit operates as a multiplexer circuit to output output signals of one of the first and second selecting units and other output signals of the other column selecting unit during the read operation.

14. The flash memory device as claimed in claim 13, further comprising a data output circuit for receiving output signals of the multiplexer circuit and outputting the received output signals through the data input/output pins.

15. A flash memory device with a plurality of data input/output pins defining a predetermined data width, comprising:
    a memory cell array of memory cells arranged into a matrix form having a plurality of word lines and a plurality of bit lines;
    a readout circuit for sensing data bits stored in the memory cells through a plurality of the bit lines and temporarily latching the sensed data bits;
    a column selecting circuit including a first column selecting unit and a second column selecting unit,
    wherein the first column selecting unit responds to first column selecting signals and second column selecting signals and sequentially selects first groups of latched data bits, and wherein the second column selecting unit responds to first column selecting signals and third column selecting signals and sequentially selects second groups of latched data bits;
    a column decoder circuit for decoding a column address and generating the first, second and third column selecting signals,
    wherein the second and third column selecting signals are sequentially and simultaneously activated to cause the data bits to be outputted from the first and second column selecting units;
    a first internal data bus for transferring the latched data bits of the first group selected by the first column selecting unit;
    a second internal data bus for transferring the latched data bits of the second group selected by the second column selecting unit;
    a controlling circuit for generating output enable signals according to a portion of column address bits during a verify interval;
    a logic circuit for receiving first output signals of the first column selecting unit transferred through the first internal data bus and second output signals of the second column selecting unit transferred through the second internal data bus and for multiplying corresponding output signals out of the received first and second output signals in response to the output enable signals during a verify interval; and
    a pass/fail check circuit for determining whether the output signals of the logic circuit have the same value,
    wherein widths of the first and second internal data buses are identical with the predetermined data width of the memory device.

16. The flash memory device as claimed in claim 15, further comprising an address detection circuit for receiving a column address and detecting whether the column address is the final column address during the verify interval.

17. The flash memory device as claimed in claim 16, wherein generation of the column address is stopped when the final column address is detected.

18. The flash memory device as claimed in claim 15, wherein, when a program loop includes a program interval and a verify interval, the verify interval occurs after the program interval.

19. The flash memory device as claimed in claim 15, wherein, when a program loop includes a program interval and a verify interval, the verify interval occurs during the program interval.

20. The flash memory device as claimed in claim 15, wherein the column decoder circuit generates the first through third column selecting signals, in order that all first groups of the latched data bits are sequentially selected by the first column selecting unit and all second groups of the latched data bits are sequentially selected by the second column selecting unit during a read operation.

21. The flash memory device as claimed in claim 15, wherein the logic circuit operates as a multiplexer circuit to output output signals of any one of the first and second column selecting units and other output signals of the other column selecting unit during a read operation.

22. The flash memory device as claimed in claim 21, further comprising a data output circuit for receiving output signals of the multiplexer circuit and outputting the received output signals through the data input/output pins during the read operation.

23. A NAND-type flash memory device with a plurality of page buffers for defining a predetermined data width, comprising:
    a memory cell array of memory cells arranged into a matrix form of a plurality of rows and a plurality of columns;
    a readout circuit including a plurality of page buffers divided into a first, second, third and fourth page buffer groups,
    wherein each of the page buffers is connected to a corresponding column, senses data from the memory cell array through the corresponding column and temporarily latches the sensed data;
    a column gate circuit including a first, second, third and fourth column selecting units corresponding to the first, second, third and fourth page buffer groups, respectively,
    wherein each of the first, second, third and fourth column selecting units selects a portion of data bits latched to a corresponding page buffer group according to column selecting signals corresponding to common column selection signals;
    an internal data transferring path including a first, second, third and fourth internal data buses corresponding to the first, second, third and fourth column selecting units, respectively,
    wherein each of the first, second, third and fourth internal data buses transfers data bits outputted from the corresponding column selecting unit;
    a column pre-decoder circuit for decoding a column address and generating the column selecting signals corresponding to the common column selection signals,
    wherein the column selecting signals corresponding to the column selecting units are simultaneously and sequentially activated to cause data bits to be outputted from the first, second, third and fourth column selecting units simultaneously, a controlling circuit for generating output enable signals on the basis of a portion of column address bits during a verify operation;

a logic circuit for receiving a first, second, third and fourth output signals of the first, second, third and fourth column selecting units transferred through the first, second, third and fourth internal data buses and for multiplying corresponding output signals out of the inputted first, second, third and fourth output signals in response to the output enable signals during the verify operation; and a pass/fail check circuit for determining whether output signals of the logic circuit have the same value, wherein each width of the first, second, third and fourth internal data buses is identical with the predetermined data width of the memory device.

24. The NAND-type flash memory device as claimed in claim 23, further comprising an address detection circuit for receiving a column address and detecting whether the column address is the final column address during the verify operation.

25. The NAND-type flash memory device as claimed in claim 24, wherein generation of the column address is stopped when the final column address is detected.

26. The NAND-type flash memory device as claimed in claim 23, wherein, when a program loop includes a program interval and a verify interval, the verify operation is performed during the verify interval and after the program interval.

27. The NAND-type flash memory device as claimed in claim 23, wherein, when a program loop includes a program interval and a verify interval, the verify operation is performed during the verify interval and during the program interval.

28. The NAND-type flash memory device as claimed in claim 23, wherein the column pre-decoder circuit generates column selecting signals corresponding to the common column selection signals and each of the column selecting units, in order that data bits latched to each of the first, second, third and fourth page buffer groups are sequentially selected by a corresponding column selecting unit during a read operation.

29. The NAND-type flash memory device as claimed in claim 23, wherein the logic circuit operates as a multiplexer circuit, such that data bits latched to the first, second, third and fourth page buffer groups are sequentially outputted through the first, second, third and fourth internal data buses during the read operation.

30. The NAND-type flash memory device as claimed in claim 29, further comprising a data output circuit for receiving output signals of the multiplexer circuit and outputting the received output signals through the data input/output pins during the read operation.

* * * * *